United States Patent
Weder

(10) Patent No.: US 7,005,894 B2
(45) Date of Patent: Feb. 28, 2006

(54) ADAPTIVE VOLTAGE MONITORING

(75) Inventor: Uwe Weder, Hallertau (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/045,000

(22) Filed: Jan. 26, 2005

(65) Prior Publication Data

US 2005/0174249 A1 Aug. 11, 2005

Related U.S. Application Data

(63) Continuation of application No. PCT/DE03/02468, filed on Jul. 22, 2003.

(30) Foreign Application Priority Data

Jul. 26, 2002 (DE) ............... 102 34 181

(51) Int. Cl.
H03K 5/22 (2006.01)
H03K 5/153 (2006.01)
(52) U.S. Cl. .......................... 327/74; 327/77
(58) Field of Classification Search ............ 327/74–78; 341/158–160
See application file for complete search history.

(56) References Cited

U.S. PATENT DOCUMENTS 5,598,161 A * 1/1997 Yamada ...................... 341/159
5,856,800 A * 1/1999 Le Pailleur et al. ........ 341/159
6,535,424 B1 * 3/2003 Le et al. ................. 365/185.18
2001/0052870 A1 * 12/2001 Nagaraj et al. ............. 341/159
2002/0079933 A1 6/2002 Hubert et al.

FOREIGN PATENT DOCUMENTS

| DE | 198 14 696 C1 | 7/1999 |
|---|---|---|
| EP | 0 937 988 A1 | 8/1999 |
| JP | 58-118967 A | 7/1983 |
| JP | 60-211370 A | 10/1985 |

OTHER PUBLICATIONS

U. Tietze, et al.; "Halbleiter-Schaltungstechnik" (English translation of title—Advanced Electronic Circuits); Neunte Auflage, Berlin [u.a]; Springer-Verlag, 1991, p. 182 and p. 774; ISBN: 3-540-19475-4.

* cited by examiner

Primary Examiner—Quan Tra
(74) Attorney, Agent, or Firm—Darby & Darby

(57) ABSTRACT

A voltage monitoring arrangement including a number of comparison devices, which corresponds to a prescribed number of voltage ranges, compares the value of an input voltage with a reference voltage and outputs a prescribed signal if the input voltage is within one of the prescribed voltage ranges. The voltage monitoring arrangement has a latch circuit which, when a latch signal is applied, establishes which voltage range the input voltage is currently in when the latch signal is applied, resulting in the arrangement having automatic voltage range reduction. The voltage monitoring arrangement has a monitoring unit which outputs a predetermined signal if the input voltage is outside the voltage range which exists when the latch signal is applied.

8 Claims, 2 Drawing Sheets

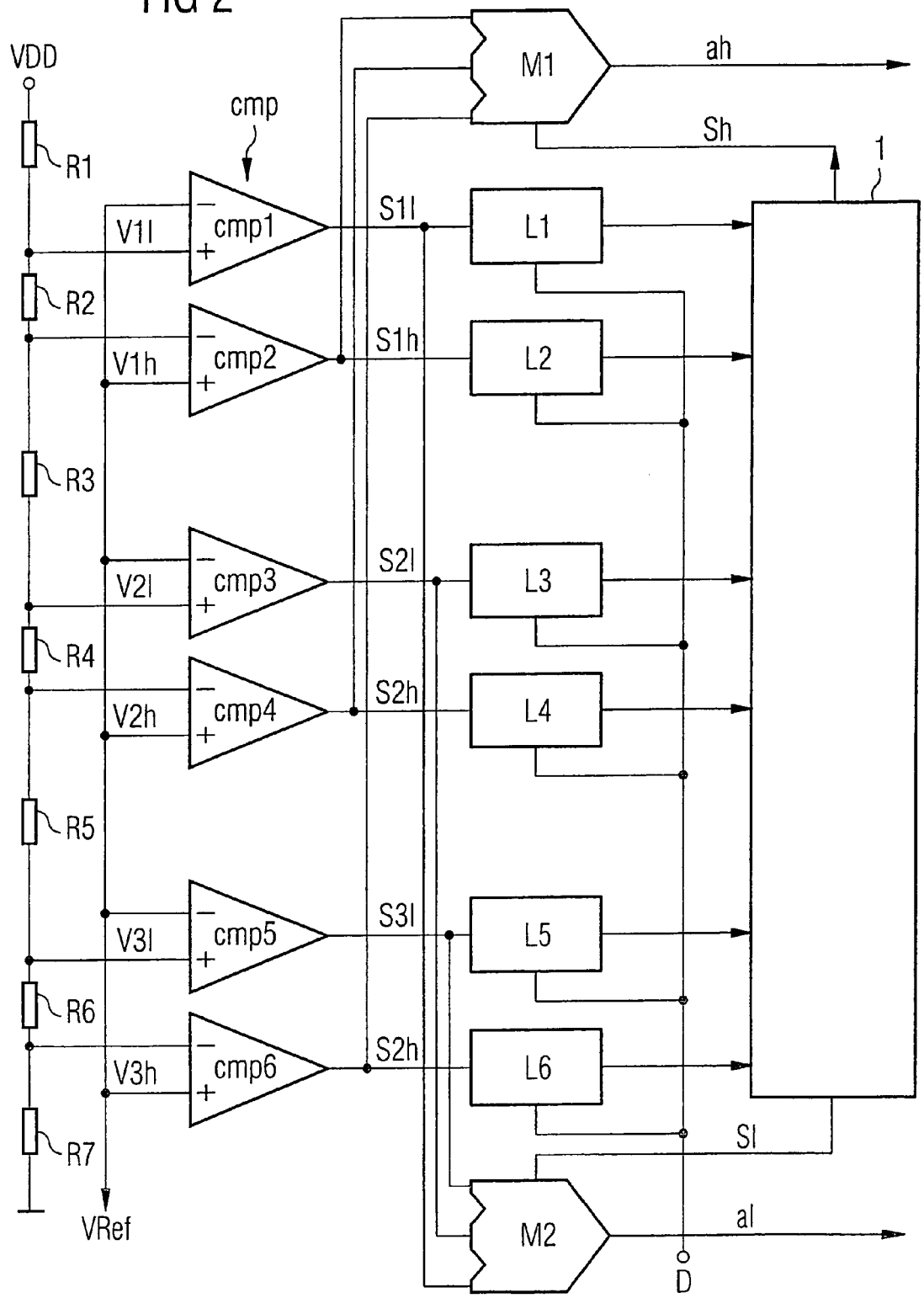

Figure 1:
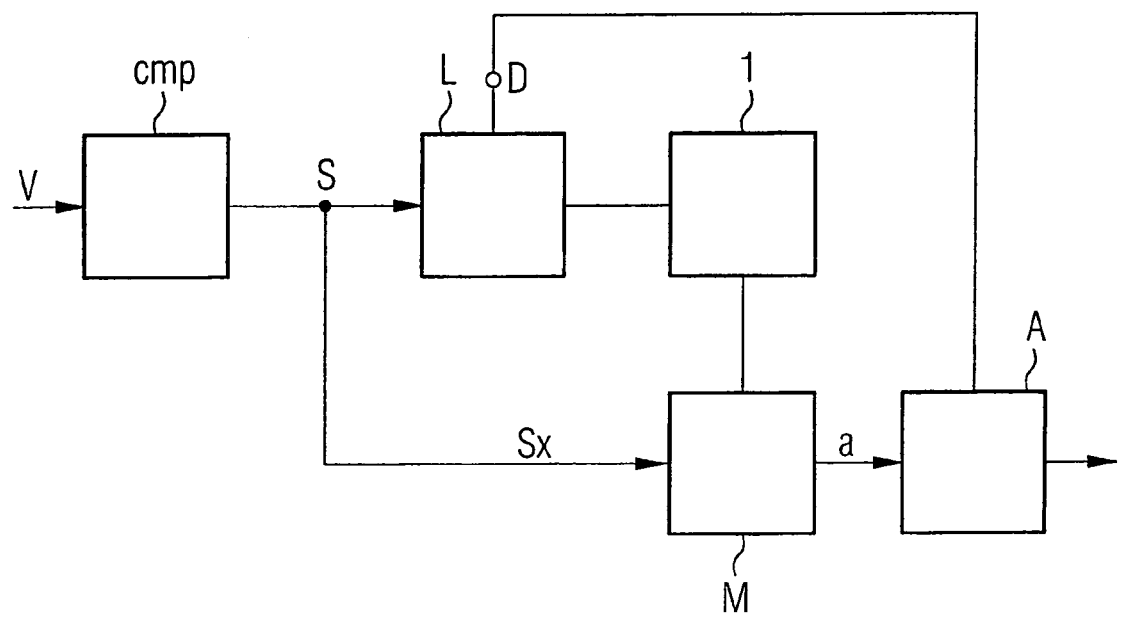

ADAPTIVE VOLTAGE MONITORING

CROSS-REFERENCE TO RELATED APPLICATIONS

The present application is a continuation of PCT patent application No. PCT/DE03/02468, filed Jul. 22, 2003, published in the German language as PCT publication No. WO 2004/017078, and claiming priority to German patent application No. 102 34 181.8, filed Jul. 26, 2002, both of which are hereby incorporated by reference in their entirety.

TECHNICAL FIELD

The invention relates to adaptive voltage monitoring and more particularly, relates to a voltage monitoring arrangement in which it is possible to prevent the occurrence of large voltage variations using simple means.

BACKGROUND

In many instances of electronic circuits, correct operation thereof requires the operating voltage to be monitored. If a permissible operating voltage range is exceeded or undershot, a malfunction signal is then produced and forwarded or the entire circuit is shutdown. Today, there are increasingly circuits which operate for different operating voltages. The permissible operating range is regularly given as a percentage of a rated voltage. Such a rated voltage naturally has to have a certain variance. If a variance of 10% is permitted, for example, then in a 5-volt range the voltage can vary between 4.5 and 5.5 volts. Relevant standards such as ETSI, GSM, ISO provide, by way of example, that a chip operating in the 5; 3; 1.8 V range is now permitted to have the entire voltage range from 5.5 to 1.62 volts. Accordingly, voltage changes, "Voltage spikes", over a very high range are possible in the externally applied voltage supply. Large voltage variations in turn can result in circuits operating incorrectly, which is in turn a problem.

Accordingly, there is a perceived need for providing a voltage monitoring arrangement in which it is possible to prevent the occurrence of large voltage variations using simple means.

SUMMARY

In one aspect, the present invention provides a voltage monitoring arrangement that overcomes the deficiencies of the prior art and accomplishes the above object.

More specifically, a voltage monitoring arrangement is provided and includes a number of comparison devices which corresponds to a prescribed number of voltage ranges. The comparison devices act to compare the value of an input voltage with a reference voltage and output a prescribed signal if the input voltage is within a prescribed voltage range. In addition, a latch circuit is provided which, when a latch signal is applied, establishes which voltage range the input voltage is currently in when the latch signal is applied. Further, a monitoring unit is provided which outputs a predetermined signal if the input voltage is outside the voltage range which is present when the latch signal is applied.

This ensures that, in principle, a broad voltage range is permissible, but that the permissible voltage range can be restricted at a particular time, for example when the occurrence of malfunctions is a problem. This means that if the admissible restricted voltage limits are exceeded within a critical period, the monitoring unit can output an alarm signal or a reset for the circuit, for example.

Other features and advantages of the present invention will be apparent from the following detailed description when read in conjunction with the following drawings.

BRIEF DESCRIPTION OF THE DRAWING FIGURES

The foregoing and other features of the present invention will be more readily apparent from the following detailed description and drawings of illustrative embodiments of the invention in which:

FIG. 1 shows a first exemplary embodiment of the voltage monitoring arrangement in a block diagram, and FIG. 2 shows a basic implementation of the exemplary embodiment for three admissible voltage ranges.

DETAILED DESCRIPTION OF PREFERRED EMBODIMENTS

The fundamental way in which an exemplary embodiment of the voltage monitoring arrangement works will first be illustrated below with reference to FIG. 1. A comparison device CMP is supplied a voltage V which is to be monitored. Depending on whether the voltage to be monitored is within a prescribed range, the comparison device outputs a corresponding signal S to an evaluation circuit. If a predetermined signal is applied to the input D of the latch circuit L, the latch circuit L latches the signal S currently applied and forwards it as an output signal to a monitoring logic unit 1. The monitoring logic unit 1 ascertains whether the voltage V is in one of the voltage ranges whose range limits are being monitored by the comparison device CMP. In addition, the monitoring logic unit 1 actuates a forwarding circuit M such that the signaling by the comparison device CMP for the ascertained voltage range is forwarded from the monitoring logic unit to an evaluation unit A. The evaluation unit A now monitors the signaling for the ascertained voltage range in order to establish whether the voltage V is within the stipulated voltage limits. As soon as the monitoring unit A establishes that the ascertained voltage range is being left, a corresponding signal is output which, by way of example, disables the entire arrangement or prompts a reset.

FIG. 2 shows a detailed example of a voltage monitoring arrangement for three voltage ranges, e.g. 5;3 and 1.8 V. An input voltage VDD to be monitored which is across the series circuit comprising the resistors R1 to R7 needs to be monitored. In this case, the voltage VDD is basically intended to be in one of three voltage ranges. The resistors have now been chosen such that, depending on which of the three voltage ranges the voltage VDD is in, the voltage drop across the resistor R2, across the resistor R4 or across the resistor R6 corresponds to a particular value which is compared with a reference voltage Vref.

The voltage potential between the resistor R2 and the resistor R1 is accordingly supplied to the positive signal input of the comparator CMP 1, and to the potential between the resistor R2 and the resistor R3 is supplied to the negative signal input of the comparator CMP 2. The negative signal input of the comparator CMP 1 and the positive signal input of the comparator CMP 2 are respectively supplied the reference voltage Vref. If the voltage VDD is within the lowest of the three voltage ranges, that is to say 1.8 V, for example, then the outputs of the two comparators CMP 1 and CMP 2 respectively produce the digital signal "1". Accordingly, the potential between the resistor R3 and the resistor R4 is supplied to the positive signal input of the comparator CMP 3, and the potential between the resistor R4 and the resistor R5 is supplied to the negative signal input of the comparator CMP 4. If the voltage VDD is in the middle one of the three voltage ranges, then the outputs of these two comparators each output a digital signal "1".

Accordingly, the potential between the resistor R5 and the resistor R6 is supplied to the positive signal input of the comparator CMP 5, and the potential between a resistor R6 and the resistor R7 is supplied to the negative signal input of the comparator CMP 6. If the voltage VDD to be monitored is in the highest of the three voltage ranges provided, e.g. 5 V, then the outputs of the two comparators CMP 5 and CMP 6 each output the digital signal "1".

While the outputs of the comparators which signal the voltage range within which the voltage VDD to be monitored lies output a digital signal "1", the respective other comparators output a digital signal "0". With correspondingly reverse logic, it is also possible to carry out reverse signaling.

The output signals from the comparators CMP 1 to CMP 6 are supplied as signals S1L, S1H, S2L, S2H, S3L, S3H to "latch" circuits L1 to L6. If a signal is supplied to the "latch" circuits L1 to L6 via the signal line D, then the currently applied signal, which can be only "1" or "0", is held until the next signaling and is output at the output. The outputs of the "latch" circuits L1 to L6 are supplied to a monitoring logic unit 1. This now monitors the output signals from the "latch" circuits L1 to L6 and ascertains which outputs produce digital signals "1". These correspond to the ascertained voltage range at the time at which a signal is transferred via the line D.

Accordingly, control lines SH and SL are used to actuate a multiplexer M1 and a multiplexer M2 which forward the output signal from the comparators CMP 1 to CMP 6 associated with the voltage range. The output signal from these comparators is now supplied as a monitoring signal for the upper or lower limit ah or al to the monitoring device A, shown only in FIG. 1, by the multiplexer M1 or M2. The monitoring device A can now initiate an alarm signal, a reset for the entire circuit or the like whenever necessary when the ascertained voltage range is left.

The arrangement described means that the entire admissible voltage range is consequently always initially open. Following detection, the range is automatically limited by means of the multiplexers M1, M2.

On account of the fact that the input-side voltage divider means that there is a voltage drop across one of the prescribed resistors R1 to R7 for each prescribed voltage range and said voltage drop is always compared with the same reference voltage Vref, the admissible relative variation can be set uniformly for each of the prescribed voltage ranges.

If the entire voltage range points between 5.5 V and 1.62 V, then voltage spikes can be 3.88 V. If the range is restricted in the manner described, then the 1.8 V range, extending between 1.98 V and 1.62 V, can admissibly produce voltage spikes of 0.36 V only.

The invention is naturally not restricted to three voltage ranges or to the arrangement illustrated. The invention naturally also covers the provision of fewer voltage ranges or more voltage ranges and circuit variants which basically operate in the same manner.

Furthermore, while exemplary drawings and specific embodiments of the present invention have been described and illustrated, it is to be understood that the scope of the present invention is not to be limited to the particular embodiments discussed. Thus, the embodiments shall be regarded as illustrative rather than restrictive, and it should be understood that variations may be made in those embodiments by workers skilled in the art without departing from the scope of the present invention as set forth in the claims that follow, and equivalents thereof. In addition, the features of the different claims set forth below may be combined in various ways in further accordance with the present invention.

What is claimed is:

1. A voltage monitoring arrangement comprising:
   a plurality of comparison devices which corresponds to a prescribed number of voltage ranges, and is configured to compare the value of an input voltage with a reference voltage and output a prescribed signal if the input voltage is within one of the prescribed voltage ranges;
   wherein for each voltage range, a respective comparator in the comparison device compares a voltage, derived from the input voltage to be monitored, for an upper and a lower voltage limit with the reference voltage;
   a latch circuit which, when a latch signal is applied, establishes which voltage range the input voltage is currently in when the latch signal is applied;
   a monitoring unit which outputs a predetermined signal if the input voltage is outside the voltage range which exists when the latch signal is applied; and
   a forwarding circuit in the monitoring unit that outputs the output signals from the comparators for an ascertained voltage range to an evaluation circuit.

2. The voltage monitoring arrangement as claimed in claim 1, wherein the evaluation circuit evaluates the output signals from the comparators only at a predetermined time.

3. The voltage monitoring arrangement as claimed in claim 2, wherein the evaluation circuit stores the output signal from the comparators at a first time as a reference value and compares the output signals from the comparators with the reference values in a predetermined time range.

4. The voltage monitoring arrangement as claimed in claim 1, wherein the input voltage is monitored across a series circuit comprising a plurality of resistors arranged in series.

5. The voltage monitoring arrangement as claimed in 4, wherein the resistors are chosen such that depending upon which voltage range the input voltage is within, the voltage drop across one of the resistors corresponds to a particular valve which is compared to the reference voltage.

6. The voltage monitoring arrangement as claimed in claim 4, wherein a voltage potential between two successive resistors is supplied to a positive signal input to a corresponding comparator, with the other of the positive or negative signal input to the corresponding comparator being the reference signal.

7. The voltage monitoring arrangement as claimed in claim 5, wherein there is a voltage drop across one of the resistors for each prescribed voltage range and the voltage drop is compared to the same reference voltage resulting in a selected relative variation being capable of being set uniformly for each of the prescribed voltage ranges.

8. The voltage monitoring arrangement as claimed in claim 1, wherein when the ascertained voltage range is left, the evaluation circuit is configured to take one or more actions selected from the group consisting of: initiating an alarm signal and resetting all circuits.

* * * * *